(12) United States Patent
Tao

(10) Patent No.: US 11,069,766 B2
(45) Date of Patent: Jul. 20, 2021

(54) DISPLAY PANEL WITH IRREGULAR SHAPE AND DISPLAY DEVICE

(71) Applicant: Shanghai Tianma AM-OLED Co., Ltd., Shanghai (CN)

(72) Inventor: Baosheng Tao, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 75 days.

(21) Appl. No.: 16/730,556

(22) Filed: Dec. 30, 2019

(65) Prior Publication Data

US 2021/0066428 A1 Mar. 4, 2021

(30) Foreign Application Priority Data

Aug. 28, 2019 (CN) .......................... 201910803998.1

(51) Int. Cl.
*H01L 27/32* (2006.01)
*G09G 3/3275* (2016.01)
*H01L 51/56* (2006.01)

(52) U.S. Cl.
CPC ....... *H01L 27/3276* (2013.01); *G09G 3/3275* (2013.01); *H01L 51/56* (2013.01); *H01L 2251/566* (2013.01)

(58) Field of Classification Search
CPC .............. G09G 3/3291; G09G 3/3275; G09G 2300/043; G09G 2320/0223
See application file for complete search history.

(56) References Cited

U.S. PATENT DOCUMENTS

| 10,367,052 | B2 * | 7/2019 | Zhang | G09G 3/3225 |
| 2018/0342572 | A1 * | 11/2018 | Park | H01L 27/3246 |
| 2019/0131360 | A1 * | 5/2019 | Lee | H01L 27/3276 |

FOREIGN PATENT DOCUMENTS

CN 107749247 A 3/2018

\* cited by examiner

*Primary Examiner* — Raj R Gupta
(74) *Attorney, Agent, or Firm* — Alston & Bird LLP

(57) ABSTRACT

A display panel with irregular shape and a display device. The display panel with irregular shape includes a plurality of first constant potential lines and a plurality of data lines with different lengths; and a display area is divided into a plurality of display subareas in the extending direction of the first constant potential lines, and at least one data line is arranged in each display subarea. For the different display subareas, a shorter one of the plurality of data lines in the display subareas is associated with a larger total overlapped area between this data line in the display subareas and the associated one of the plurality first constant potential lines.

20 Claims, 15 Drawing Sheets

DISPLAY PANEL WITH IRREGULAR SHAPE AND DISPLAY DEVICE

CROSS-REFERENCE TO RELATED APPLICATION

This application claims priority of Chinese Patent Application No. CN201910803998.1, filed on Aug. 28, 2019, which is hereby incorporated by reference in its entirety.

TECHNICAL FIELD

The present disclosure relates to the technical field of display and particularly relates to a display panel with irregular shape and a display device.

BACKGROUND

At the present stage, frequently-used display panels can be generally divided into display areas for displaying images and non-display areas for arranging peripheral driving circuits, etc. Pixels which are of array distribution in the display areas are connected with driving circuits, etc., of the non-display areas separately through switching elements. Under general conditions, each switching element is connected with one scan line and one data line, the switching elements are turned on through receiving scanning signals from the scan lines, pixels are driven to display a certain gray level through receiving data signals from the data lines, the switching elements of different pixels are connected with different combinations of scan lines and data lines, and thus, each pixel can emit light independently. At present, display areas of common display panels are all of regular rectangles, so that pixels of each row are the same in quantity, and the pixels of one row are simultaneously driven by one scan line.

SUMMARY

According to the display panel with irregular shape provided by one embodiment of the present disclosure, the display panel includes a plurality of first constant potential lines and a plurality of data lines with different lengths arranged in a display area of the display panel; the data lines and the first constant potential lines are arranged at different layer and intersected with each other and have overlapped zones in a direction vertical to the display panel; the display area is divided into a plurality of display subareas in an extending direction of the first constant potential lines, and at least one data line is arranged in each of the display subareas; and for different display subareas, the shorter the data lines in the display subareas are, the larger total overlapped areas of the data lines in the display subareas and the first constant potential lines are.

In another embodiment, in the display panel with irregular shape provided by the embodiments of the present disclosure, at least two data lines are arranged in each of the display subareas; and total overlapped areas of all data lines in the same display subarea and the first constant potential lines are the same.

In another embodiment, in the display panel with irregular shape provided by the embodiments of the present disclosure, all the data lines in the same display subarea are the same in length.

In another embodiment, in the display panel with irregular shape provided overlapped areas of the same data line and each of the first constant potential lines are same.

In one po another embodiment, the display panel with irregular shape, a width of the first constant potential lines at overlapped zones with part of the data lines is at least greater than a width of the first constant potential lines at other zones.

In another embodiment, in the display panel with irregular shape provided, a plurality of second constant potential lines are arranged in the display area, an extending direction of the second constant potential lines is same as the extending direction of the data lines; the second constant potential lines and the data lines are arranged alternately; and each of the first constant potential lines is at least electrically connected with one second constant potential line.

In another embodiments of the present disclosure, each of the first constant potential lines comprises a plurality of electrode connecting parts and first traces, each of the first traces is located between any two adjacent electrode connecting parts and electrically connected with corresponding two adjacent electrode connecting parts; each of the electrode connecting parts is electrically connected with one second constant potential line correspondingly; and the shorter the data lines overlapped with the first traces in a same first constant potential line are, the greater a width of the first traces is.

In another embodiment of the present disclosure, each of the first constant potential lines comprises a plurality of electrode connecting parts and first traces, each of the first traces is located between any two adjacent electrode connecting parts and connected with corresponding two adjacent electrode connecting parts; each of the electrode connecting parts is electrically connected with one second constant potential line correspondingly; and the shorter the data lines overlapped with the first traces in a same first constant potential line are, the greater a width of the first traces at overlapped zones with the data lines is; and the width of the first traces at the overlapped zones with the data lines is greater than a width of the first traces at other zones.

In another embodiment of the present disclosure further includes storage electrodes arranged in the display area, the storage electrodes are arranged in one-to-one correspondence to all the electrode connecting parts, and arranged at a layer different from a layer where the electrode connecting parts are; and the storage electrodes and corresponding electrode connecting parts have overlapped zones in a direction vertical to the display panel and form memory capacitors.

In another embodiment of the present disclosure, orthographic projections of the electrode connecting parts on the storage electrodes cover the storage electrodes.

In another embodiment of the present disclosure further includes a plurality of scan lines arranged in the display area of the display panel; and the scan lines and the storage electrodes are arranged at a same layer.

In another embodiment of the present disclosure, the second constant potential lines and the data lines are arranged at a same layer.

In another embodiments of the present disclosure, further includes a plurality of third constant potential lines arranged in the display area of the display panel; and an extending direction of the third constant potential lines is a same as an extending direction of the first constant potential lines, and each first constant potential line is at least electrically connected with one third constant potential line.

In one possible implementation mode, in the display panel with irregular shape provided by the embodiments of the present disclosure, for different display subareas, the shorter the data lines in the display subareas are, the larger total overlapped areas of the data lines in the display subareas and all the third constant potential lines are.

In one possible implementation mode, in the display panel with irregular shape provided by the embodiments of the present disclosure, the first constant potential lines include supply voltage signal lines.

In one possible implementation mode, in the display panel with irregular shape provided by the embodiments of the present disclosure, at least part of edges of the display area are of a curved edge, rounded corner, bevel edge or cut, and the data lines extend to the curved edge, rounded corner, bevel edge or cut.

In one possible implementation mode, in the display panel with irregular shape provided by the embodiments of the present disclosure, the display area includes a gap, hollow or blind hole, and the data lines of the display area extend to the gap, hollow or blind hole.

In one possible implementation mode, in the display panel with irregular shape provided by the embodiments of the present disclosure, a shape of the edge of the display area is of a polygon, circle or ellipse.

Correspondingly, embodiments of the present disclosure further provide a display device including any one of the display panel with irregular shapes provided by the embodiments of the present disclosure.

DETAILED DESCRIPTION OF THE EMBODIMENTS

Figure 1:
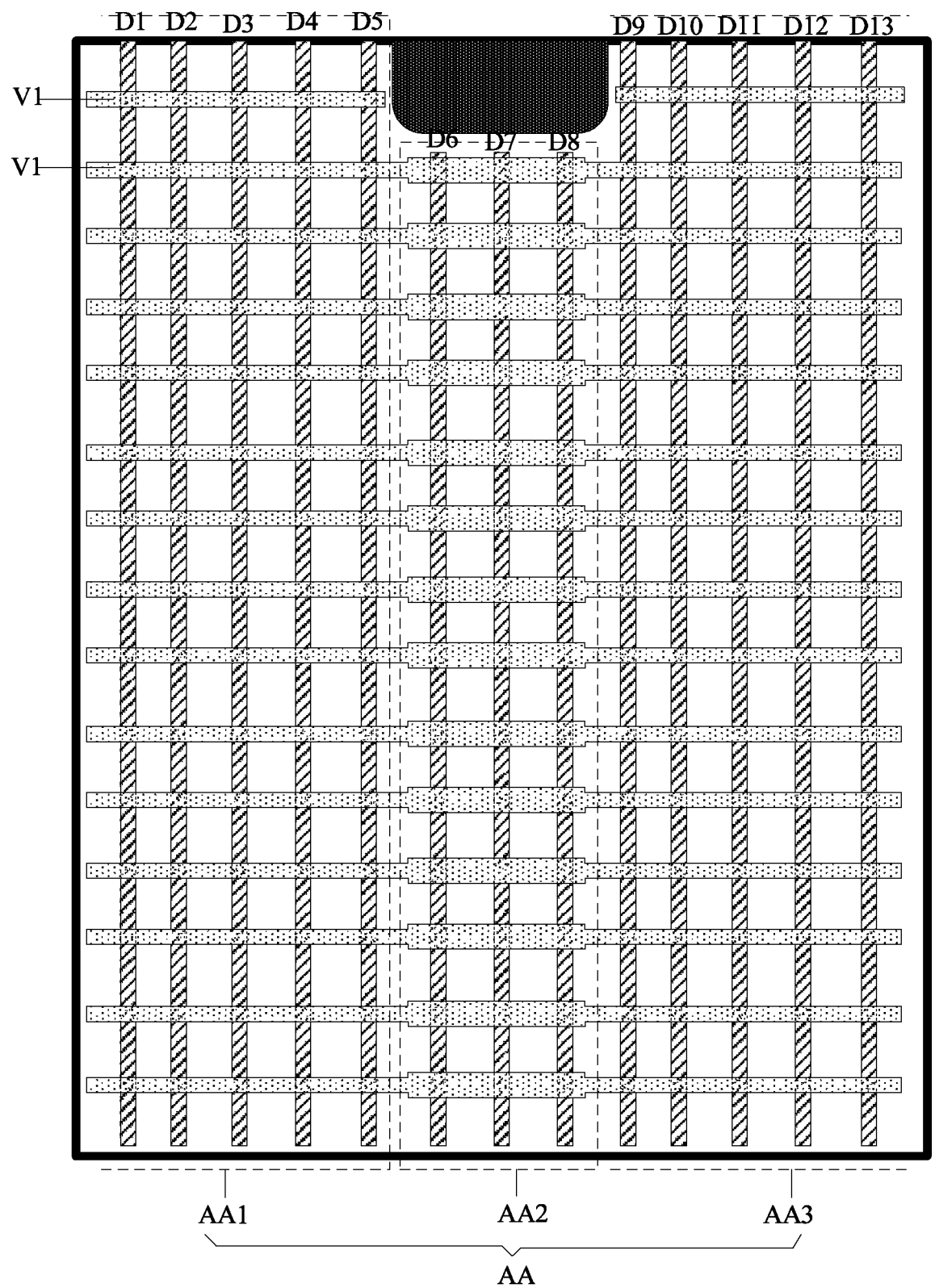
FIG. 1 is a structural schematic diagram of a display panel with irregular shape provided by one embodiment of the present disclosure.

In the practical application, conventional display panels are rectangular, a plurality of pixels which are of matrix distribution are arranged in the display panels, grid driving circuits and source driving circuits are arranged in non-display areas of the display panels, the grid driving circuits are used for providing scanning signals for the pixels of each row, the source driving circuits are used for providing data signals for the pixels of each column, and the pixels of one column connected with each data line are equal in quantity in the conventional display panels. During actual production, the data lines will pass through non-open areas of pixels of one column, so that inherent resistance of the data lines and resistance and capacitance between the data lines and elements such as transistors in the pixels will become loads of the data lines. In order to adapt to some special requirements, display panels may be designed into other non-rectangular shapes, part of pixels of pixel matrixes in the display panels will be cut away from locations such as edges and interior, then, the condition that pixels involved by pixel columns are unequal in quantity will be caused, then, loads of data lines connected with pixels of each column will be different due to unequal quantity of the pixels, then, signals input to the pixels of each column have difference when the same signals are loaded, and thus, the problem of nonuniform display is caused.

In order to reduce load difference among the data lines, compensating components (such as capacitors and resistors) can be additionally designed for data lines with relatively small lengths (namely lesser loads) and are connected with the data lines, however, part of display areas originally for arranging the pixels or non-display areas will be sacrificed to arrange the above-mentioned compensating components.

Taking this into consideration, embodiments of the present disclosure provide a display panel with irregular shape and a display device. Loads of data lines are compensated through increasing areas of overlapped zones between the data lines with relatively small lengths and first constant potential signal lines, and thus, display areas cannot be occupied; and load compensating components are not required to be additionally designed for the data lines, and thus, the increase of the area of the display areas and design of narrow bezels are facilitated.

In order to enable the above-mentioned objects, characteristics and advantages of the present disclosure to be more obvious and comprehensible, the present disclosure is further described below in conjunction with drawings and embodiments. However, demonstrated embodiments can be implemented in a variety of forms, and it should not be understood that embodiments are limited to those elaborated herein; and contrarily, the presenting of these embodiments makes the present disclosure more comprehensive and complete, and concepts of the demonstrated embodiments can be comprehensively transferred to those skilled in the art. In figures, the same drawing marks represent the same or similar structures; therefore, repeated description for the same drawing marks will be omitted. Words expressing locations and directions described in the present disclosure are all described by taking the drawings for example, however, changes may also be made as required, and the changes made all fall within the scope of protection of the present disclosure. The drawings of the present disclosure are only used for showing relative position relationships and do not represent a real proportion.

It is necessary to note that details are elaborated in the following description to facilitate sufficient understanding of the present disclosure. However, the present disclosure can be implemented in a variety of other manners different from those described herein, and similar popularization may be made by those skilled in the art without departing from connotations of the present disclosure. Therefore, the present disclosure is not restricted to specific embodiments disclosed below. Subsequent descriptions of the description are preferred embodiments for implementing the present application; however, the descriptions are intended for describing general rules of the present application, rather than defining the scope of the present application. The scope of protection of the present application should be limited by attached claims.

A display panel and a display device provided by embodiments of the present disclosure are specifically described below in conjunction with drawings.

Figure 2:
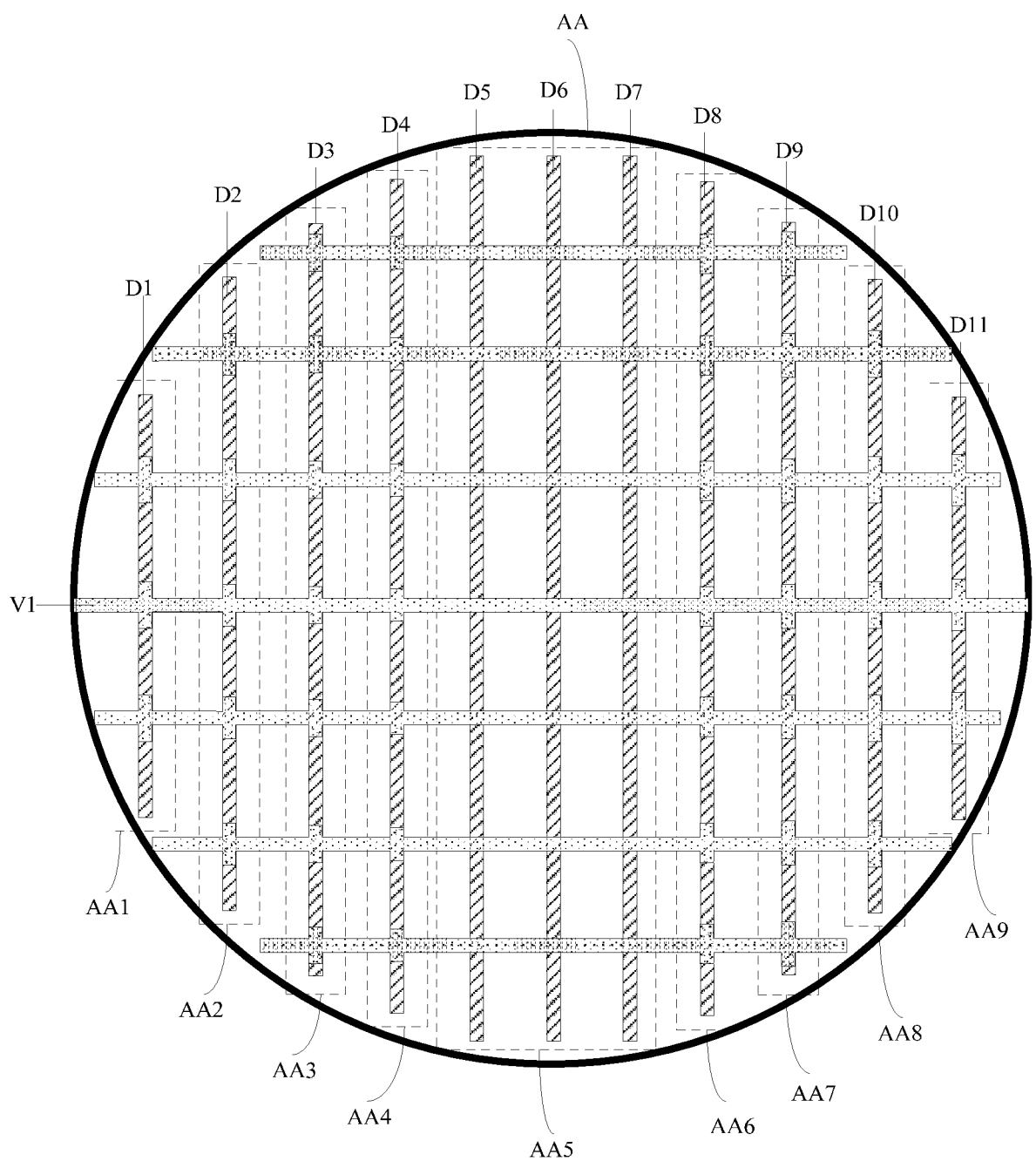
FIG. 2 is a structural schematic diagram of a display panel with irregular shape provided by another embodiment of the present disclosure.

Referring to FIG. 1 and FIG. 2, FIG. 1 is a structural schematic diagram of a display panel with irregular shape provided by one embodiment of the present disclosure; and FIG. 2 is a structural schematic diagram of a display panel with irregular shape provided by another embodiment of the present disclosure. According to the display panel with irregular shape provided by the embodiments of the present disclosure, a plurality of first constant potential lines V1 and a plurality of data lines D1~DN with different lengths are arranged in a display area AA of the display panel with irregular shape;

the data lines Dn and the first constant potential lines V1 are of different-layer and cross arrangement and have overlapped zones in a direction vertical to the display panel;

the display area AA is divided into a plurality of display subareas AA1~AAM in the extending direction of the first constant potential lines V1 (it is demonstrated that for example, M is equal to 3 in FIG. 1 and M is equal to 9 in FIG. 2), and at least one data line Dn is arranged in each display subarea AAn;

for different display subareas AAn, the shorter the data lines Dn in the display subareas AAn are, the larger total overlapped areas of the data lines Dn in the display subareas AAn and the first constant potential lines V1 are.

The display panel with irregular shape provided by the embodiments of the present disclosure includes a plurality of first constant potential lines and a plurality of data lines with different lengths; and a display area is divided into a plurality of display subareas in the extending direction of the first constant potential lines, and at least one data line is arranged in each display subarea. The data lines in different display subareas are different in length, different lengths of the data lines mean that the quantity of pixels connected with the data lines is different and loads of the data lines are different, therefore, in order to compensate load difference among the data lines, for the different display subareas, the shorter the data lines in the display subareas are, the larger total overlapped areas of the data lines in the display subareas and the first constant potential lines are, and thus, capacitances between the data lines and the first constant potential lines are increased, so that loads of the data lines connected with less quantity of pixels are increased, the problem of nonuniform display of the display panel is solved, and the display effect is improved.

During specific implementation, when adjacent data lines Dn are different in length, the adjacent data lines Dn can be distributed into different display subareas AAn, namely, one data line Dn is arranged in one display subarea AAn, for example display subareas AA1~AA4 in FIG. 2, thus, compensating can be performed as long as the data lines are different in length, and the uniformity of display is improved. Of course, when adjacent data lines Dn are less in length difference or the same in length, the adjacent data lines Dn can be distributed into the same display subarea AAn, namely, a plurality of data lines Dn are arranged in one display subarea AAn, for example AA1~AA3 in FIG. 1, a display subarea AA5 in FIG. 2, and thus, for the data lines Dn in the same display subarea AAn, compensating is performed by employing the same capacitance.

Therefore, in some optional embodiments, referring to FIG. 1, at least two data lines are arranged in the display subarea AAn; and total overlapped areas of each data line Dn in the same display subarea AAn and the first constant potential lines V1 are the same. Namely, in the same display subarea AAn, total capacitances formed by each data line Dn and all the first constant potential lines V1 are all the same, and load compensations of all the data lines Dn are all the same.

Further, in some optional embodiments, referring to FIG. 1 and FIG. 2, all data lines Dn in the same display subarea AAn are the same in length. Namely, in the same display subarea AAn, all data lines Dn are the same in load difference and the same in load compensation, and thus, the improvement on uniformity of display is facilitated.

In some optional embodiments, referring to FIG. 1 and FIG. 2, with regard to a plurality of first constant potential lines V1 which separately have overlapped areas with the same data line Dn, overlapped areas of the same data line Dn and all the first constant potential lines V1 are all the same, and thus, the regular distribution of layout is facilitated.

Of course, during specific implementation, overlapped areas of the same data line and all the first constant potential lines may also be different as long as that the condition that total overlapped areas of each data line in the same display subarea and the first constant potential lines are the same is guaranteed, and limitation is not made herein.

In the embodiments of the present disclosure, the data lines and first constant potential signal lines are located in different metal layers, insulating layers are arranged between the data lines and the first constant potential signal lines, so that capacitances will be generated when the data lines and the first constant potential signal lines have overlapped zones in a direction vertical to a display panel, and this part of capacitances are used for compensating load differences of the data lines resulting from length differences as loads of the data lines. Wherein, the data lines and the first constant potential signal lines corresponding to the overlapped zones serve as two poles of capacitors, so that the larger the area of the overlapped zones of the data lines and the first constant potential signal lines is, the larger the capacitance is, and the larger the load compensation value is. Therefore, during specific implementation, the area of the overlapped zones can be increased by means of increasing line width. Concretely, according to the embodiments of the present disclosure, loads of the data lines can be increased by means of increasing the line width of the first constant potential lines with overlapped zones with the data lines, the line width of corresponding locations of the first constant potential lines with the overlapped zones with the data lines is increased during production, and compensating loads are not required to be independently arranged in display areas or non-display areas.

Figure 3:
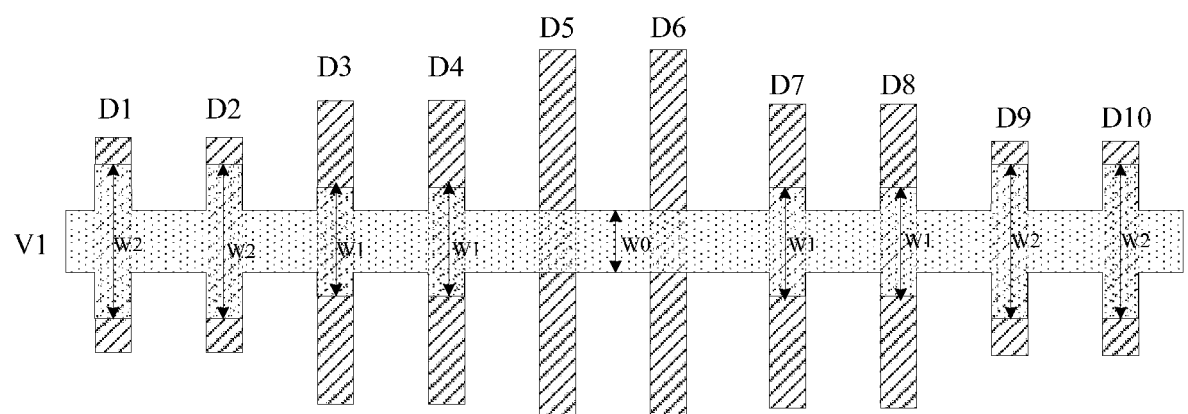
FIG. 3 is a structural schematic diagram of a first constant potential line provided by one embodiment of the present disclosure.

Optionally, in the display panel with irregular shape provided by the embodiments of the present disclosure, referring to FIG. 3, FIG. 3 is a structural schematic diagram of one first constant potential line of the display panel with irregular shape provided by one embodiment of the present disclosure; and the width of the first constant potential lines V1 at overlapped zones with part of the data lines Dn is at least greater than the width at other zones. For example, in FIG. 3, both the width W2 of the first constant potential lines V1 at the overlapped zones with the data lines D1, D2, D9 and D10 and the width W1 of the first constant potential lines V1 at the overlapped zones with the data lines D3, D4, D7 and D8 are greater than the width W0 of the first constant potential lines V1 at the other zones.

Figure 4:
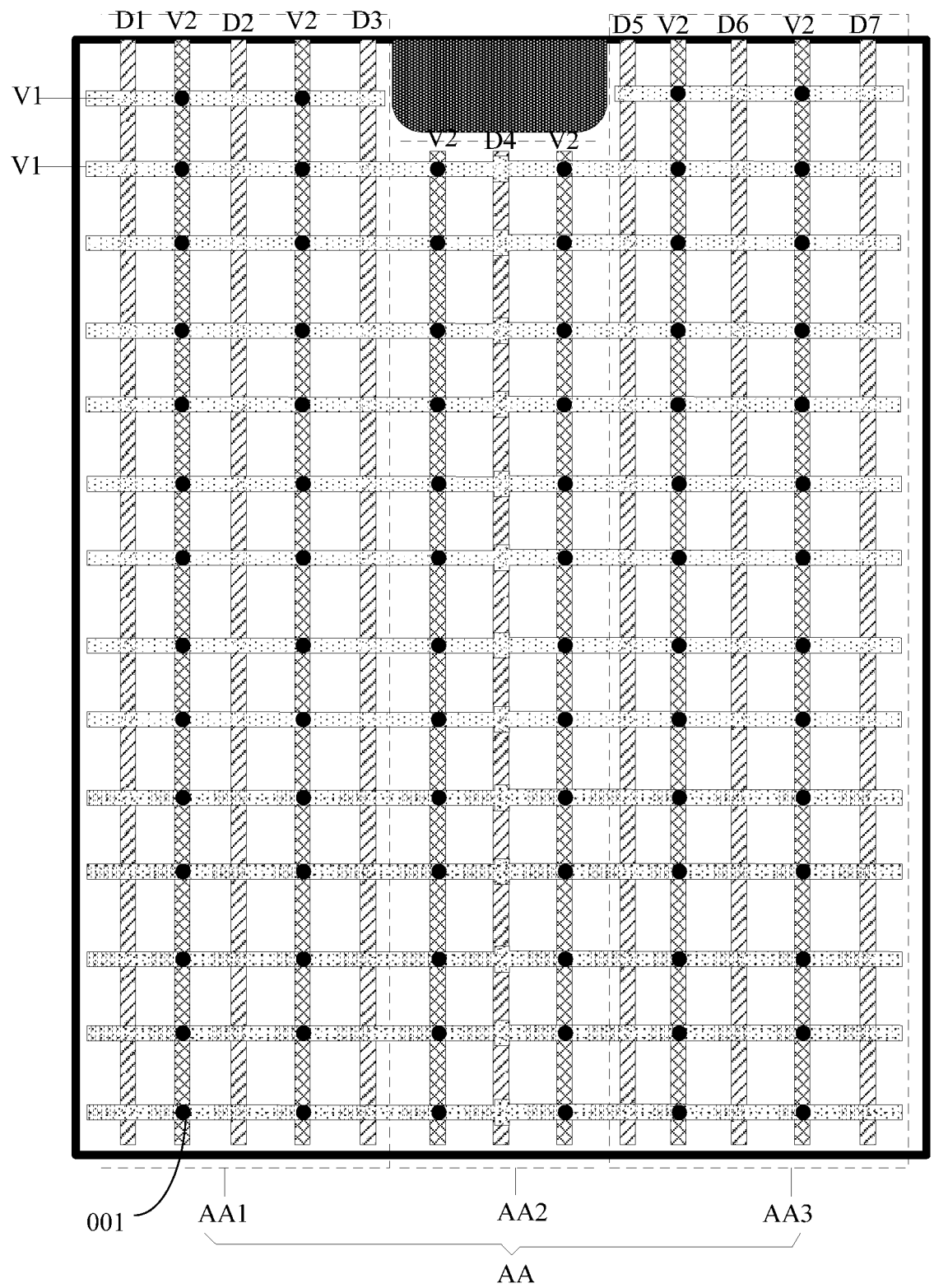
FIG. 4 is a structural schematic diagram of a display panel with irregular shape provided by another embodiment of the present disclosure.

During specific implementation, voltages applied to all first constant potential lines are the same, and all pixels of the display panel are connected with the first constant potential lines, so that in order to facilitate that all the pixels of the display panel are connected with the first constant potential lines and the voltages applied to all the first constant potential lines are the same, referring to FIG. 4, FIG. 4 is a structural schematic diagram of a display panel with irregular shape provided by another embodiment of the present disclosure, a plurality of second constant potential lines V2, of which the extending direction is the same as the extending direction of the data lines Dn, are further arranged in the display area AA;

the second constant potential lines V2 and the data lines Dn are arranged alternately; and each first constant potential line V1 is at least electrically connected with one second constant potential line V2. In this way, all first constant potential lines V1 are connected through the second constant potential lines V2, and the first constant potential lines V1 and the second constant potential lines V2 are connected to form a network, so that voltages of all the first constant potential lines V1 tend to be the same. Moreover, during specific implementation, the first constant potential lines V1 are electrically connected with the second constant potential lines V2 generally through via holes 001.

Figure 5:
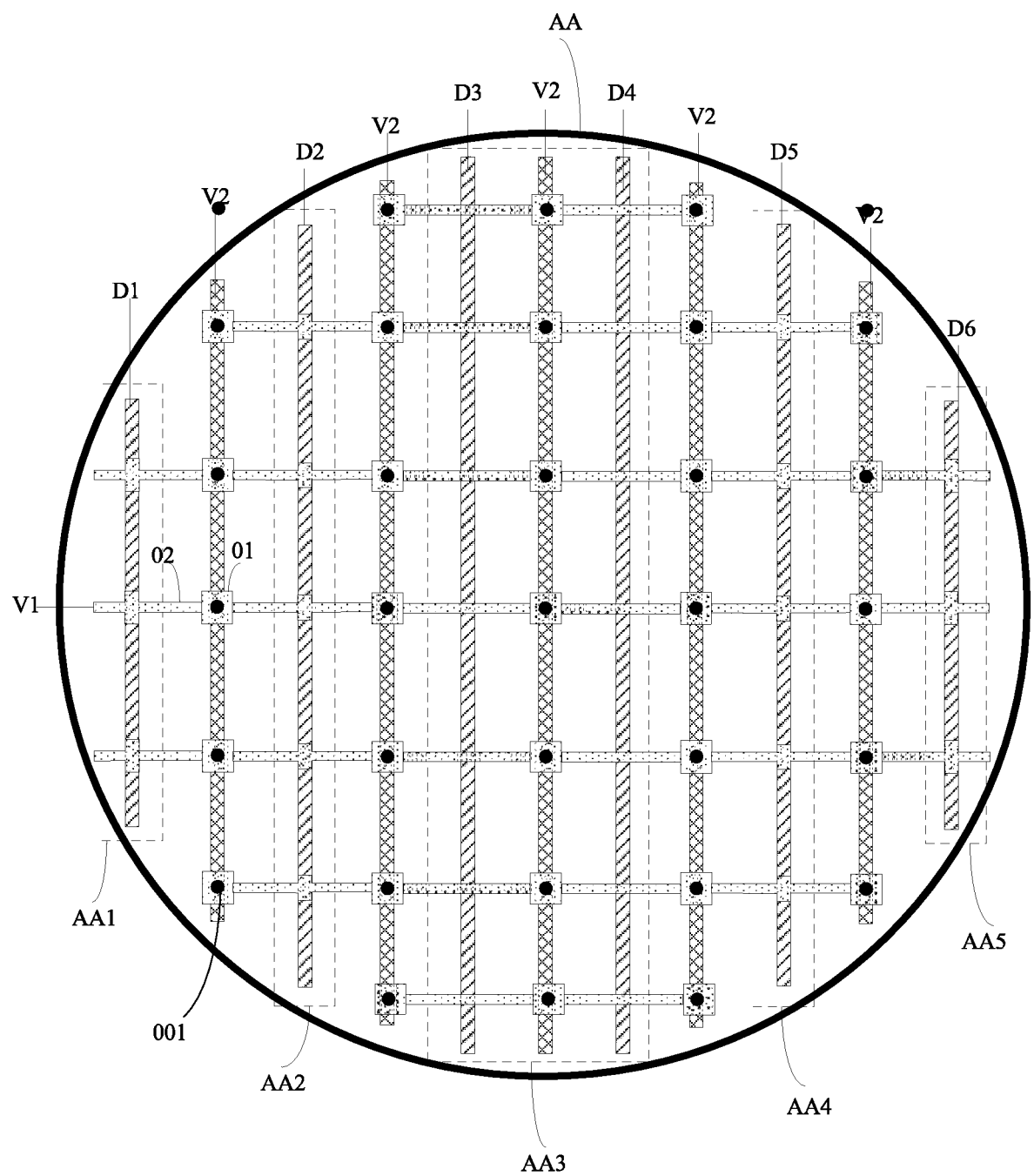
FIG. 5 is a structural schematic diagram of a display panel with irregular shape provided by another embodiment of the present disclosure.
Figure 6:
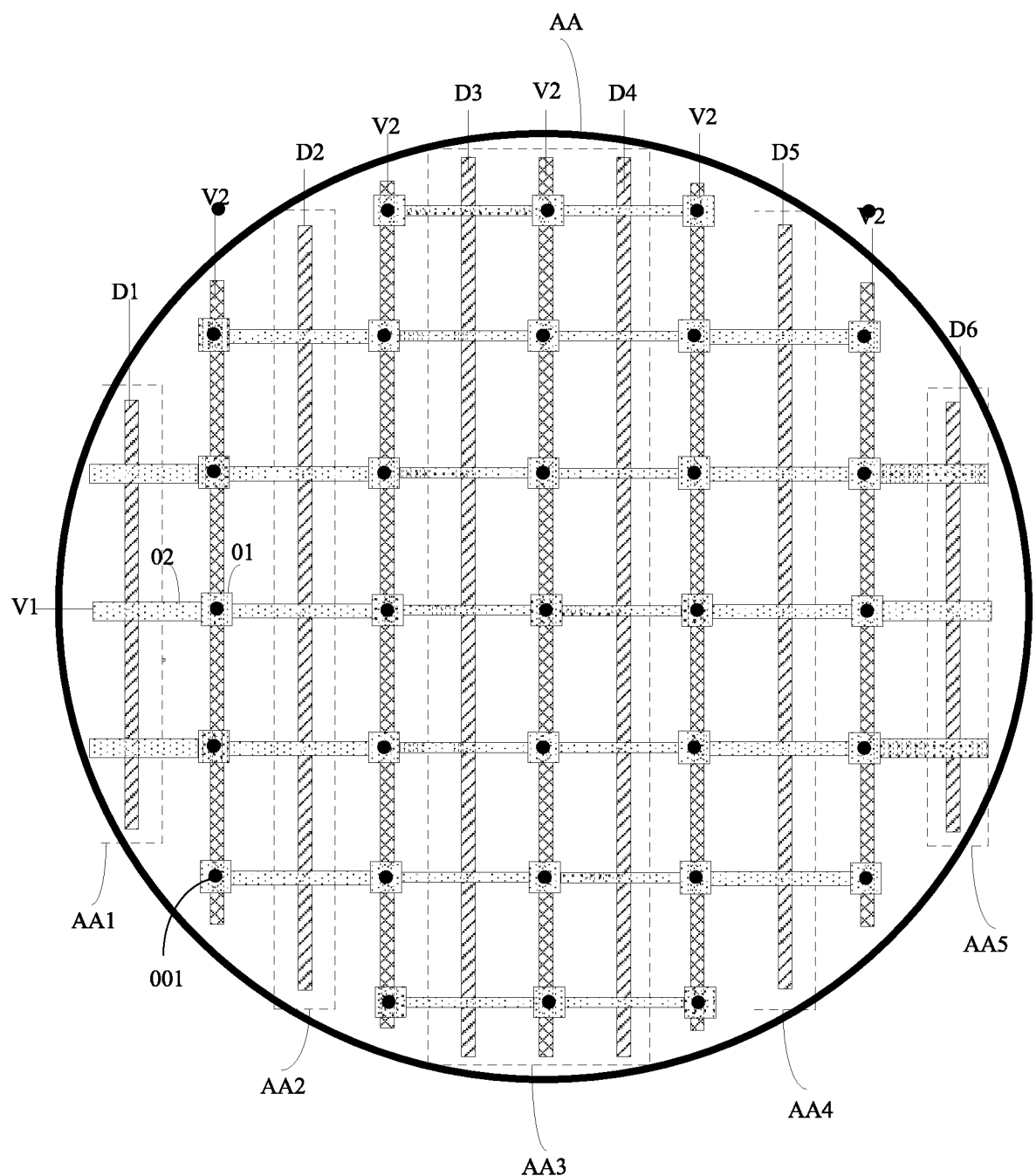
FIG. 6 is a structural schematic diagram of a display panel with irregular shape provided by another embodiment of the present disclosure.
Figure 7:
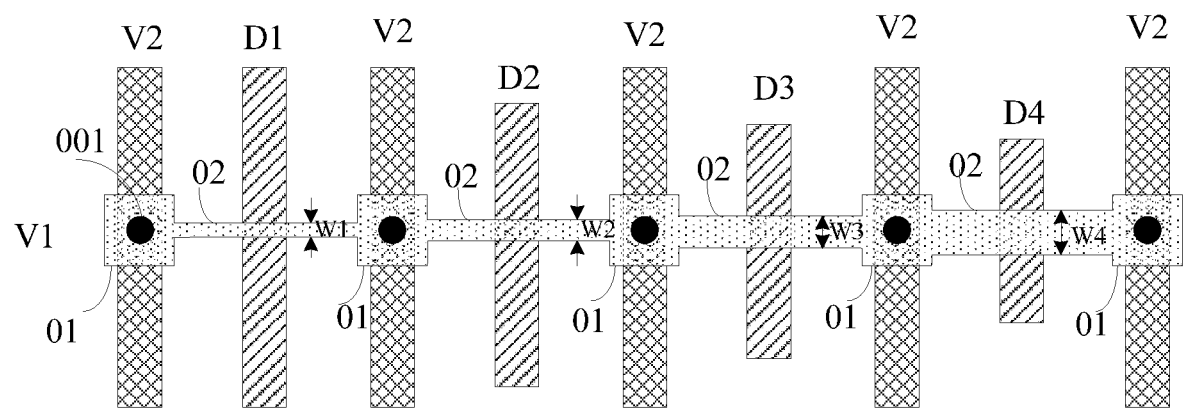
FIG. 7 is a structural schematic diagram of a first constant potential line provided by another embodiment of the present disclosure.

Optionally, in the display panel with irregular shape provided by the embodiments of the present disclosure, referring to FIG. 5 and FIG. 6, FIG. 5 is a structural schematic diagram of a display panel with irregular shape provided by another embodiment of the present disclosure; FIG. 6 is a structural schematic diagram of a display panel with irregular shape provided by another embodiment of the present disclosure; each first constant potential line V1 includes a plurality of electrode connecting parts 01 and first traces 02 which are located between any two adjacent electrode connecting parts 01 and are electrically connected with corresponding two adjacent electrode connecting parts 01;

each electrode connecting part 01 is electrically connected with one second constant potential line V2 correspondingly; and referring to FIG. 6 and FIG. 7, FIG. 7 is a structural schematic diagram of a first constant potential line provided by another embodiment of the present disclosure; and in the same first constant potential line V1, the shorter the data lines Dn overlapped with the first traces 02 are, the greater the width Wn of the first traces 02 is. For example, in FIG. 7, the width of the first traces 02 overlapped with the data line D1 is W1, the width of the first traces 02 overlapped with the data line D2 is W2, the width of the first traces 02 overlapped with the data line D3 is W3, the width of the first traces 02 overlapped with the data line D4 is W4, and lengths of the data lines D1~D4 meet that D1>D2>D3>D4, so that widths Wn of the first traces 02 overlapped with the data lines Dn meet that W1<W2<W3<W4. Consequently, areas of overlapped zones of the first traces 02 and the data lines Dn are increased by means of increasing the integral line width of the first traces 02, and then, loads of the data lines Dn are increased. The line width of the first traces 02 with the overlapped zones with the data lines Dn is required to be increased during production, and compensating loads are not required to be independently arranged in display areas or non-display areas.

Figure 8:
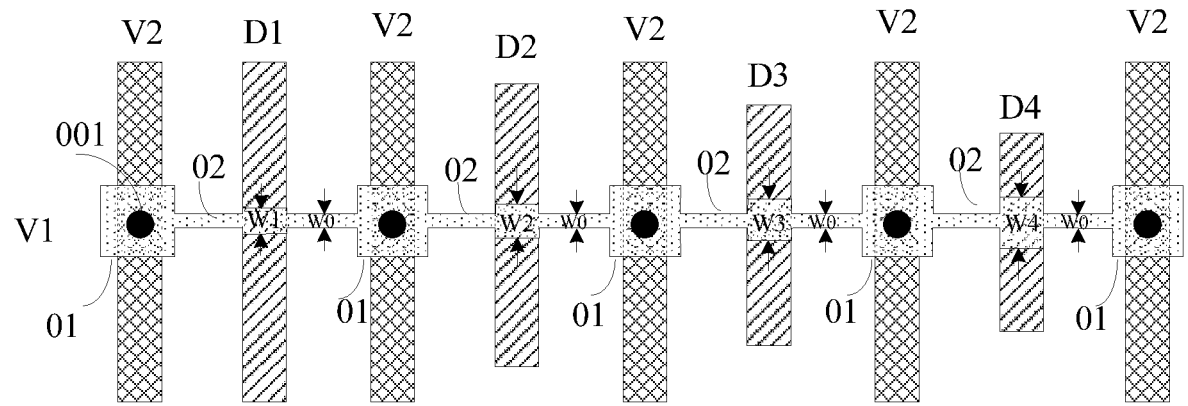
FIG. 8 is a structural schematic diagram of a first constant potential line provided by another embodiment of the present disclosure.

Or, referring to FIG. 5 and FIG. 8, FIG. 8 is a structural schematic diagram of a first constant potential line provided by another embodiment of the present disclosure; in the same first constant potential line V1, the shorter the data lines Dn overlapped with the first traces 02 are, the greater the width Wn of the first traces 02 at overlapped zones with the data lines Dn is; and the width Wn of the first traces 02 at the overlapped zones with the data lines Dn is greater than the width W0 at other zones. For example, in FIG. 8, the width of the first traces 02 overlapped with the data line D1 at overlapped zones is W1, the width of the first traces 02 overlapped with the data line D2 at overlapped zones is W2, the width of the first traces 02 overlapped with the data line D3 at overlapped zones is W3, the width of the first traces 02 overlapped with the data line D4 at overlapped zones is W4, the width of all the first traces 02 at other zones is W0, and lengths of the data lines D1~D4 meet that D1>D2>D3>D4, so that widths Wn of the first traces 02 overlapped with the data lines Dn at overlapped zones meet that W1<W2<W3<W4. Furthermore, W0<W1<W2<W3<W4, namely equivalently, only the width of the first traces 02 at zones overlapped with the data lines Dn is increased in the extending direction of the data lines Dn, thus, areas of overlapped zones of the first traces 02 and the data lines Dn are increased by means of increasing the line width of the first traces 02 at the zones overlapped with the data lines Dn, and then, loads of the data lines Dn are increased. The line width of the first traces 02 with the overlapped zones with the data lines Dn at the zones overlapped with the data lines Dn is required to be increased during production, and compensating loads are not required to be independently arranged in display areas or non-display areas.

In one embodiment, referring to FIG. 7 and FIG. 8, in first constant potential lines V1, first traces 02 and electrode connecting parts 01 are of same-layer integrated structures. Moreover, during specific implementation, referring to FIG. 5 to FIG. 8, the electrode connecting parts 01 can be connected with the second constant potential lines V2 generally through via holes 001.

During specific implementation, when the display panel with irregular shape provided by the embodiments of the present disclosure is applied to an OLED display panel, the first constant potential lines generally may include supply voltage signal lines PVDD. The supply voltage signal lines PVDD and data lines have overlapped zones in a direction vertical to the display panel, so that areas of overlapped zones between the supply voltage signal lines PVDD and all data lines can be increased when the line width of the supply voltage signal lines PVDD is increased, and thus, load capacitance of the data lines can be increased.

Figure 9:
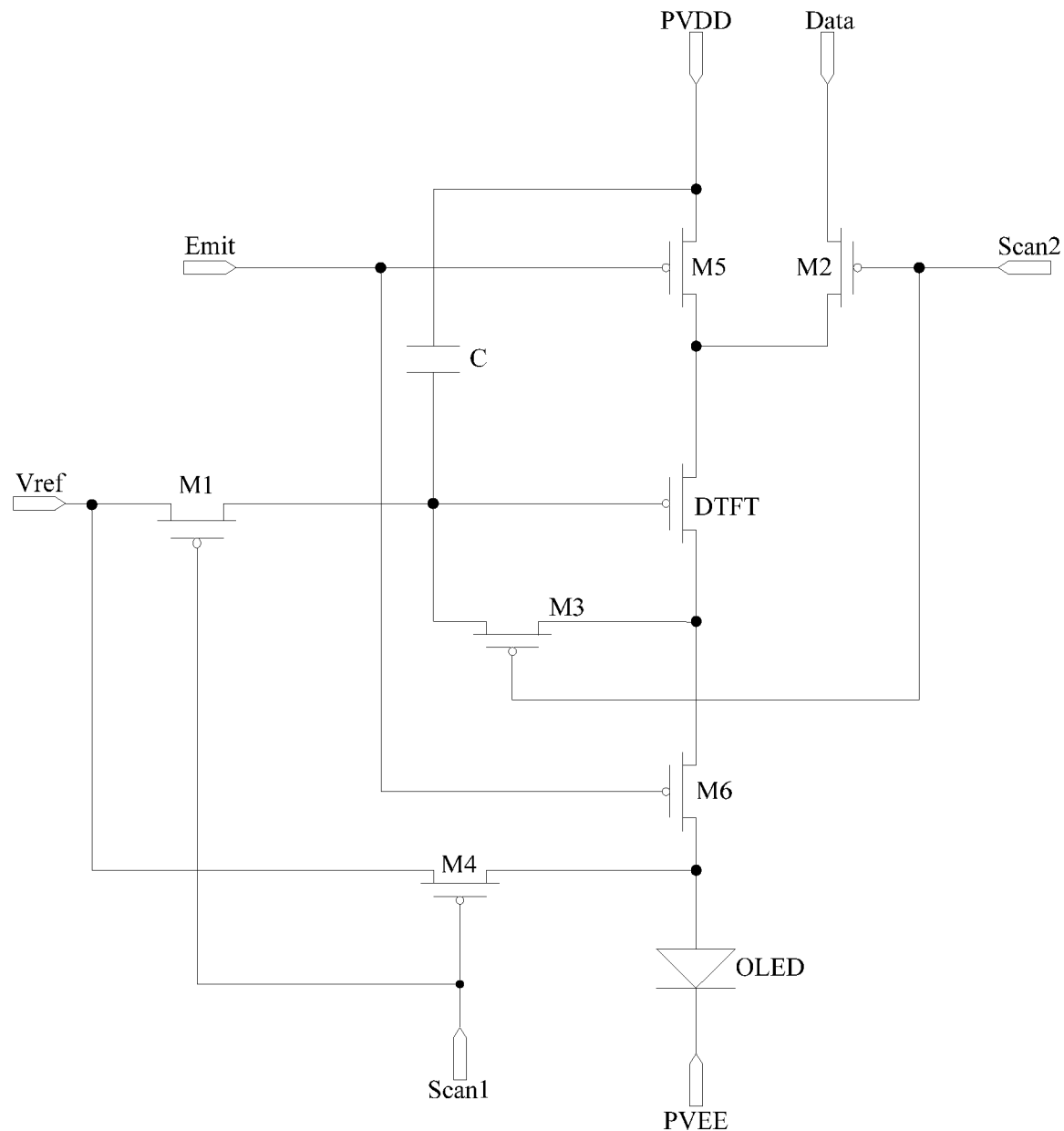
FIG. 9 is a circuit structural schematic diagram of a pixel.

Further, in the OLED display panel, a pixel includes an organic light-emitting diode OLED, a plurality of switching transistors, a driving transistor and a memory capacitor C, wherein the switching transistors, the driving transistor and the memory capacitor C are used for cooperating with one another to control the OLED to emit light; for example, FIG. 9 is a circuit structural schematic diagram of a pixel, wherein, the pixel includes six switching transistors M1~M6, one driving transistor DTFT, one memory capacitor C and one OLED. Generally, a first pole d1 of the memory capacitor C is connected with a supply voltage signal line PVDD, and a second pole d2 of the memory capacitor C is connected with a grid of the driving transistor DTFT. The memory capacitor C is used for stabilizing the grid voltage of the driving transistor DTFT.

Optionally, in the display panel with irregular shape provided by the embodiments of the present disclosure, first constant potential lines include supply voltage signal lines.

In the OLED display panel, a buffer layer, an active layer, a grid insulating layer, a first metal layer, an insulating layer, a second metal layer, an insulating layer, a third metal layer, a passivating layer, an anode layer, a light-emitting layer and a cathode layer are sequentially stacked on a substrate generally. The first metal layer includes scan lines and gate electrodes of transistors, the third metal layer includes data lines, supply voltage signal lines PVDD and source and drain electrodes of the transistors, and the second metal layer includes first constant potential lines.

Figure 10:
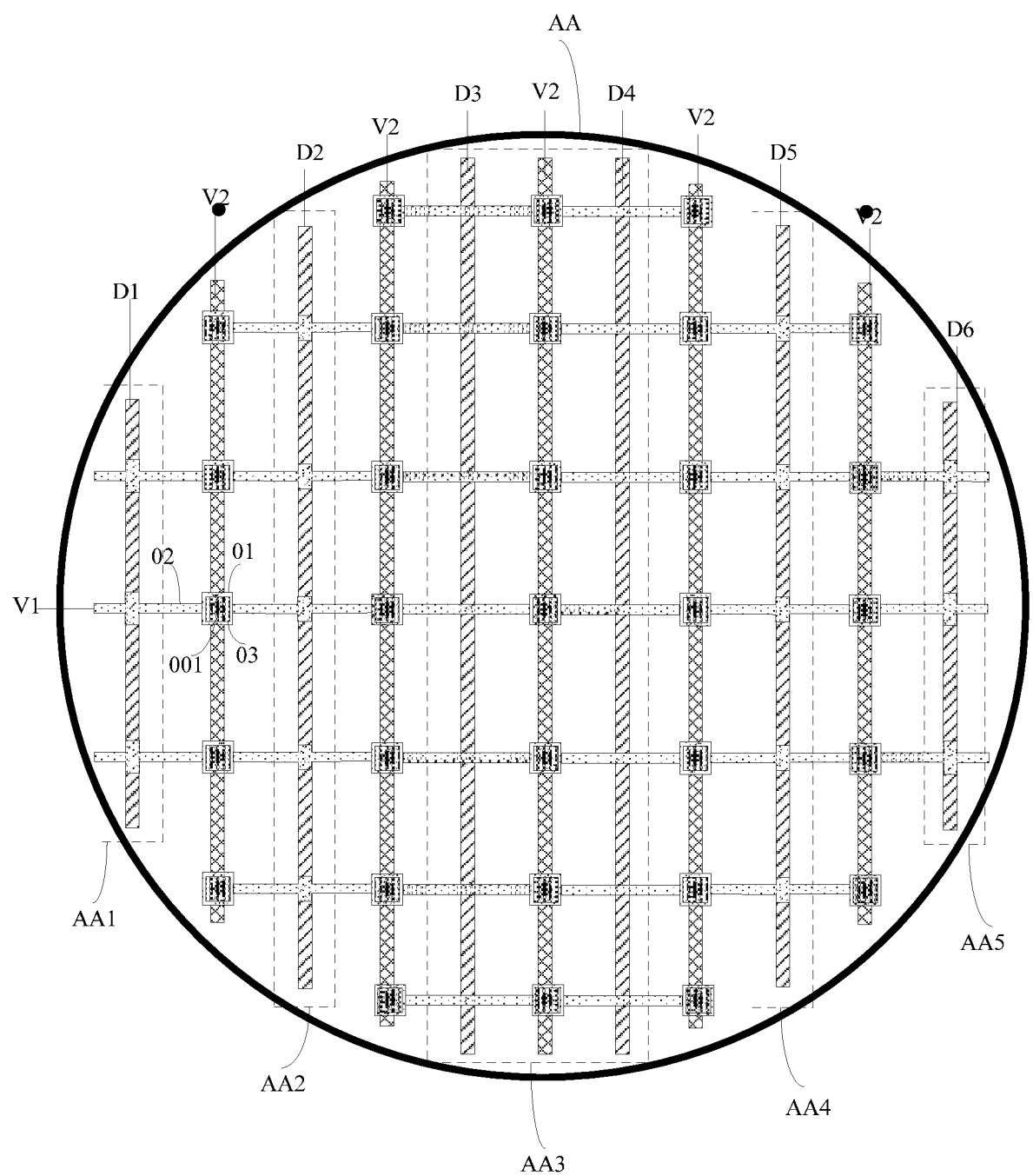
FIG. 10 is a structural schematic diagram of a display panel with irregular shape provided by another embodiment of the present disclosure.

In some optional embodiments, referring to FIG. 10, FIG. 10 is a structural schematic diagram of a display panel with irregular shape provided by another embodiment of the present disclosure; storage electrodes 03 which are in one-to-one correspondence to all electrode connecting parts 01 are further arranged in the display area AA of the display panel with irregular shape, the storage electrodes 03 and all the electrode connecting parts 01 are of different-layer arrangement, optionally the storage electrodes 03 are made from the first metal layer and can also be made from other metal layers in other embodiments.

The storage electrodes 03 and corresponding electrode connecting parts 01 have overlapped zones in a direction vertical to the display panel and form memory capacitors. Each electrode connecting part 01 is reused as one electrode of one memory capacitor, implementation can be achieved by only changing compositions of original first constant potential lines without adding a composition process, so that processing steps are reduced, process time is shortened, and the production cost is reduced.

Figure 11:
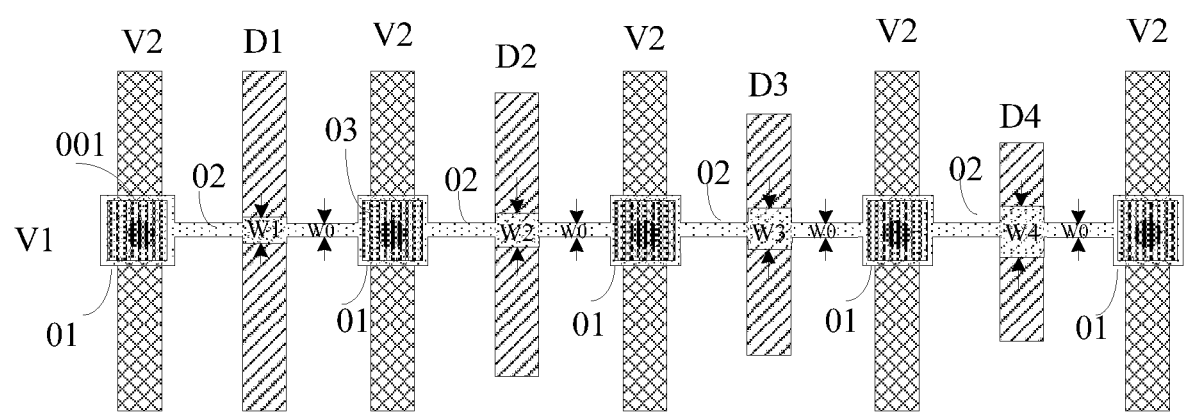
FIG. 11 is a local structural schematic diagram of a display panel with irregular shape provided by one embodiment of the present disclosure.

Optionally, in the display panel with irregular shape provided by the embodiments of the present disclosure, referring to FIG. 10 and FIG. 11, FIG. 11 is a local structural schematic diagram of a display panel with irregular shape provided by one embodiment of the present disclosure; and orthographic projections of the electrode connecting parts 01 on the storage electrodes 03 cover the storage electrodes. Consequently, the reduction of the aperture ratio of pixels can be avoided as far as possible when the memory capacitor is formed.

Optionally, in the display panel with irregular shape provided by the embodiments of the present disclosure, a plurality of scan lines are further arranged in a display area of the display panel with irregular shape; and the scan lines and storage electrodes are of same-layer arrangement. Thus, implementation can be achieved by only changing compositions of original scan lines without adding a composition process, so that processing steps are reduced, process time is shortened, and the production cost is reduced.

Optionally, in the display panel with irregular shape provided by the embodiments of the present disclosure, the second constant potential lines and the data lines are of same-layer arrangement. Thus, implementation can be achieved by only changing compositions of original data lines without adding a composition process, so that processing steps are reduced, process time is shortened, and the production cost is reduced.

Figure 12:
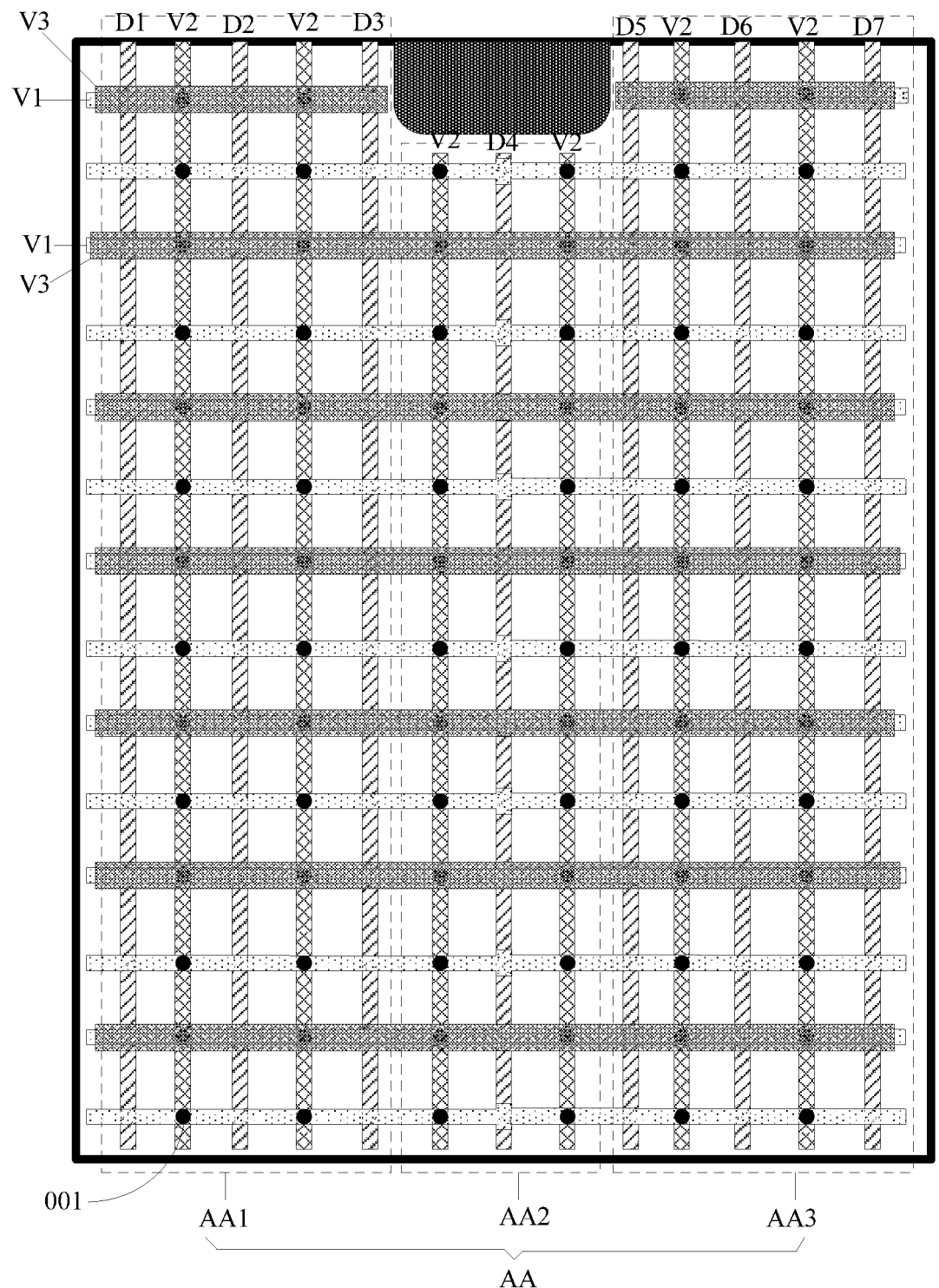
FIG. 12 is a structural schematic diagram of a display panel with irregular shape provided by another embodiment of the present disclosure.

Optionally, in the display panel with irregular shape provided by the embodiments of the present disclosure, referring to FIG. 12, FIG. 12 is a structural schematic diagram of a display panel with irregular shape provided by another embodiment of the present disclosure; and a plurality of third constant potential lines V3 are further arranged in a display area AA of the display panel with irregular shape;

the extending direction of the third constant potential lines V3 is the same as the extending direction of the first constant potential lines V1, and the third constant potential lines V3 and the first constant potential lines V1 are located at different metal layers and can be electrically connected through via holes 001. Consequently, the transmission capability of signals of the first constant potential lines V1 is strengthened by using the third constant potential lines V3.

Optionally, in the embodiments of the present disclosure, referring to FIG. 12, the third constant potential lines V3 and the first constant potential lines V1 are of overlapped arrangement, optionally, the third constant potential lines V3 and the first constant potential lines V1 are completely overlapped, and limitation is not made herein. In FIG. 12, the condition that the third constant potential lines V3 are located above the first constant potential lines V1 is illustrated, during specific implementation, the third constant potential lines V3 can also be located between the first constant potential lines V1 and a substrate, and limitation is not made herein.

During specific implementation, the quantity of the third constant potential lines V3 can be the same as the quantity of the first constant potential lines V1, of course, can also be smaller than that of the first constant potential lines V1, and limitation is not made herein. In FIG. 12, the condition that the quantity of the third constant potential lines V3 is equal to half of the quantity of the first constant potential lines V1 is illustrated.

Figure 13:
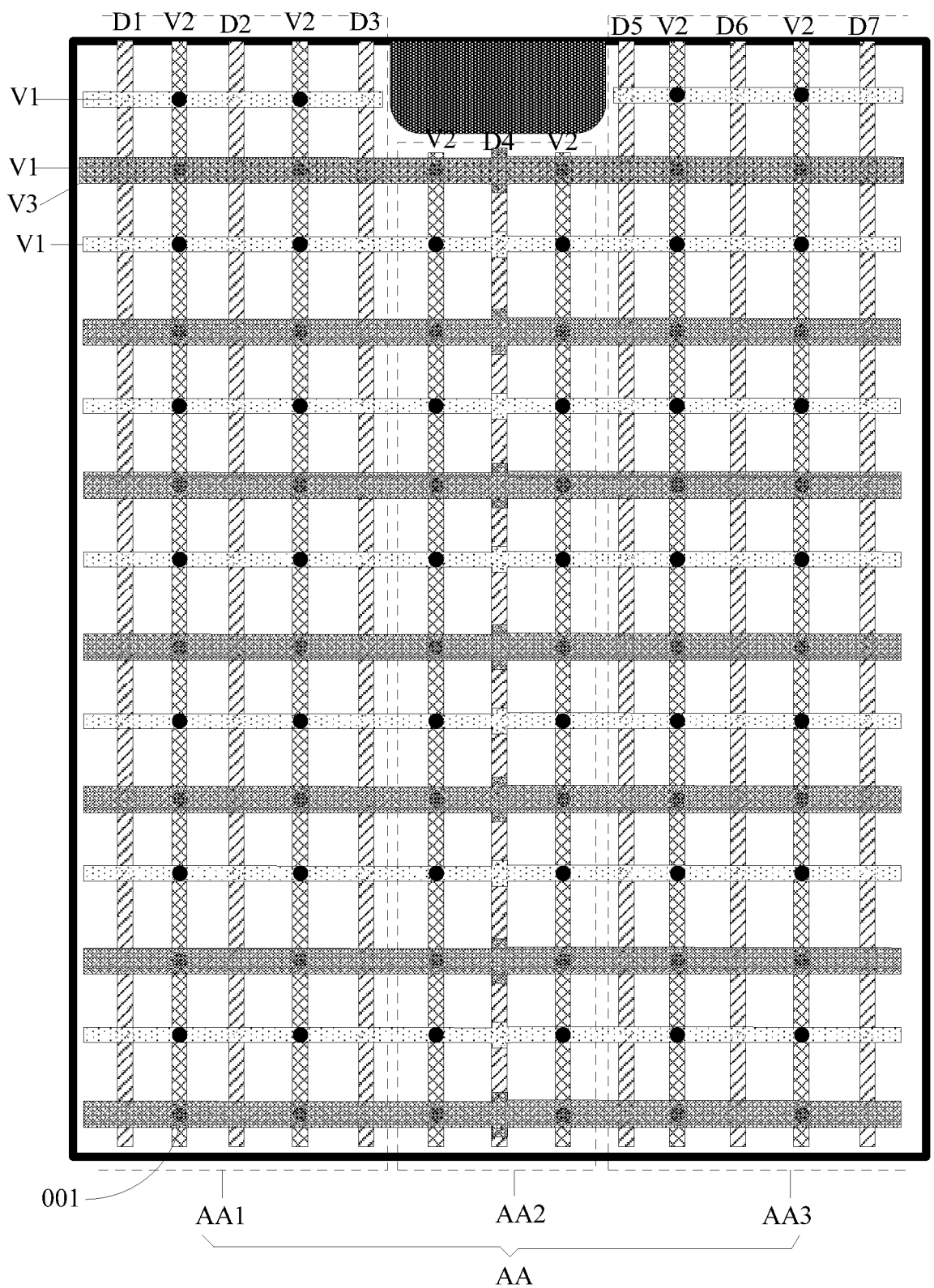
FIG. 13 is a structural schematic diagram of a display panel with irregular shape provided by another embodiment of the present disclosure.

Optionally, in the display panel with irregular shape provided by the embodiments of the present disclosure, referring to FIG. 13, FIG. 13 is a structural schematic diagram of a display panel with irregular shape provided by another embodiment of the present disclosure; and for different display subareas AAn, the shorter the data lines Dn in the display subareas AAn are, the larger total overlapped areas of the data lines Dn in the display subareas AAn and all the third constant potential lines V3 are. Thereby, capacitances between the data lines Dn and the third constant potential lines V3 are increased, and the data lines Dn are subjected to load compensation by further using the capacitances formed between the third constant potential lines V3 and the data lines Dn, so that loads of the data lines Dn connected with less quantity of pixels are increased, the problem of nonuniform display of the display panel is solved, and the display effect is improved.

Optionally, in FIG. 13, the third constant potential lines V3 and the first constant potential lines V1 are of overlapped arrangement, and the third constant potential lines V3 are located above the first constant potential lines V1.

Optionally, the principle of carrying out load compensation on the data lines Dn by using the capacitances formed between the third constant potential lines V3 and the data lines Dn is the same as that by using capacitances formed between the first constant potential lines V1 and the data lines Dn, so that a specific implementation mode of the third constant potential lines V3 can refer to that of the first constant potential lines V1, and no further description is needed.

During specific implementation, a display area of the display panel with irregular shape provided by the embodiments of the present disclosure can be of any non-rectangular shape. For example, the shape of the display area may be of a circle, an ellipse, a triangle, a heart, a hexagon, a sector, etc., and limitation is not made herein.

Figure 14:
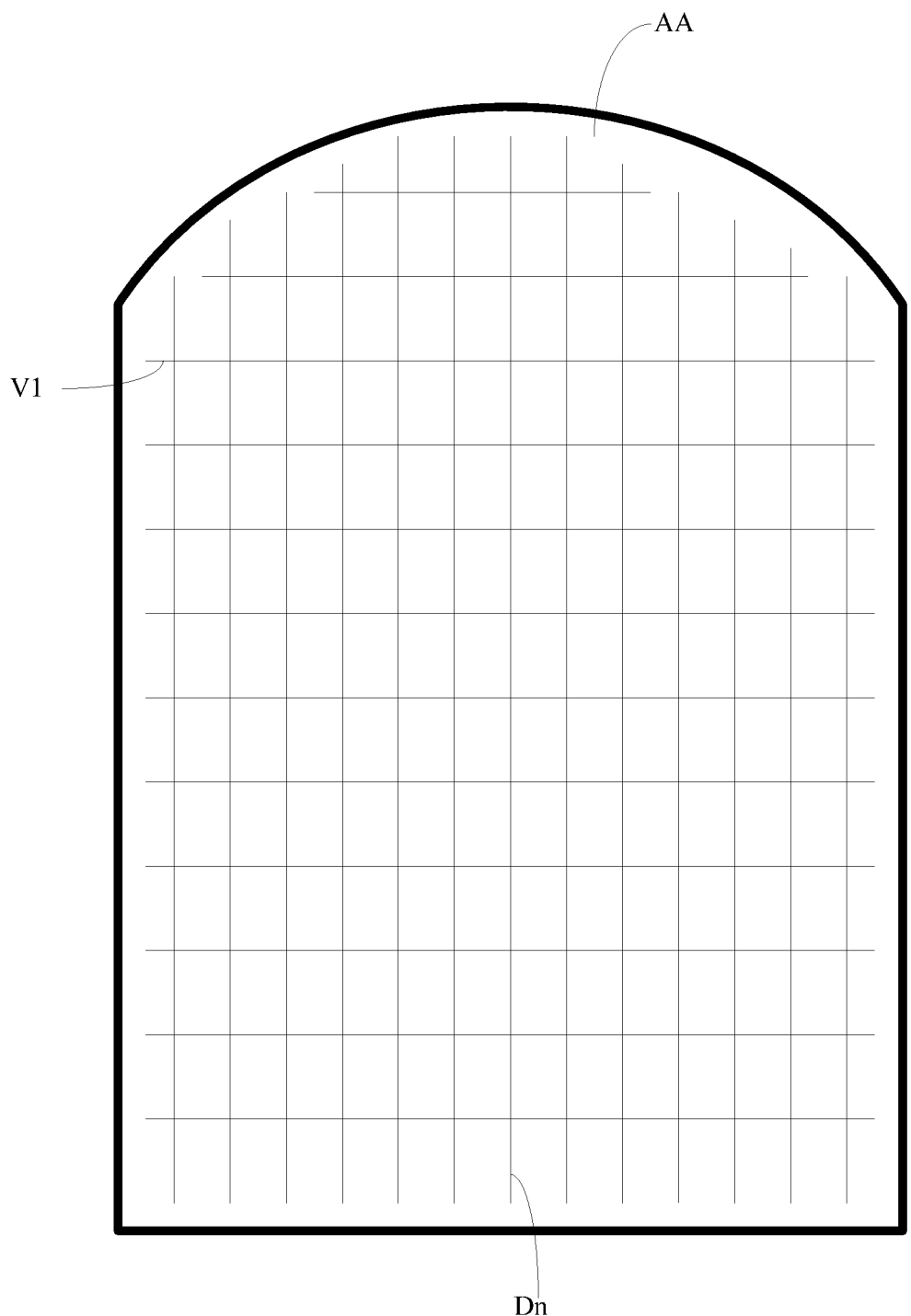
FIG. 14 is a structural schematic diagram of a display panel with irregular shape provided by another embodiment of the present disclosure.

Optionally, in the display panel with irregular shape provided by the embodiments of the present disclosure, at least part of edges of a display area are of a curved edge, rounded corner, bevel edge or cut, and the data lines extend to the curved edge, rounded corner, bevel edge or cut. For example, FIG. 14 shows a structural schematic diagram of a display panel with irregular shape provided by another embodiment of the present disclosure, the upper side edge of a display area AA is of a curved edge, the data lines Dn extend to the curved edge, and the curved edge can be of an axisymmetric structure.

Figure 15:
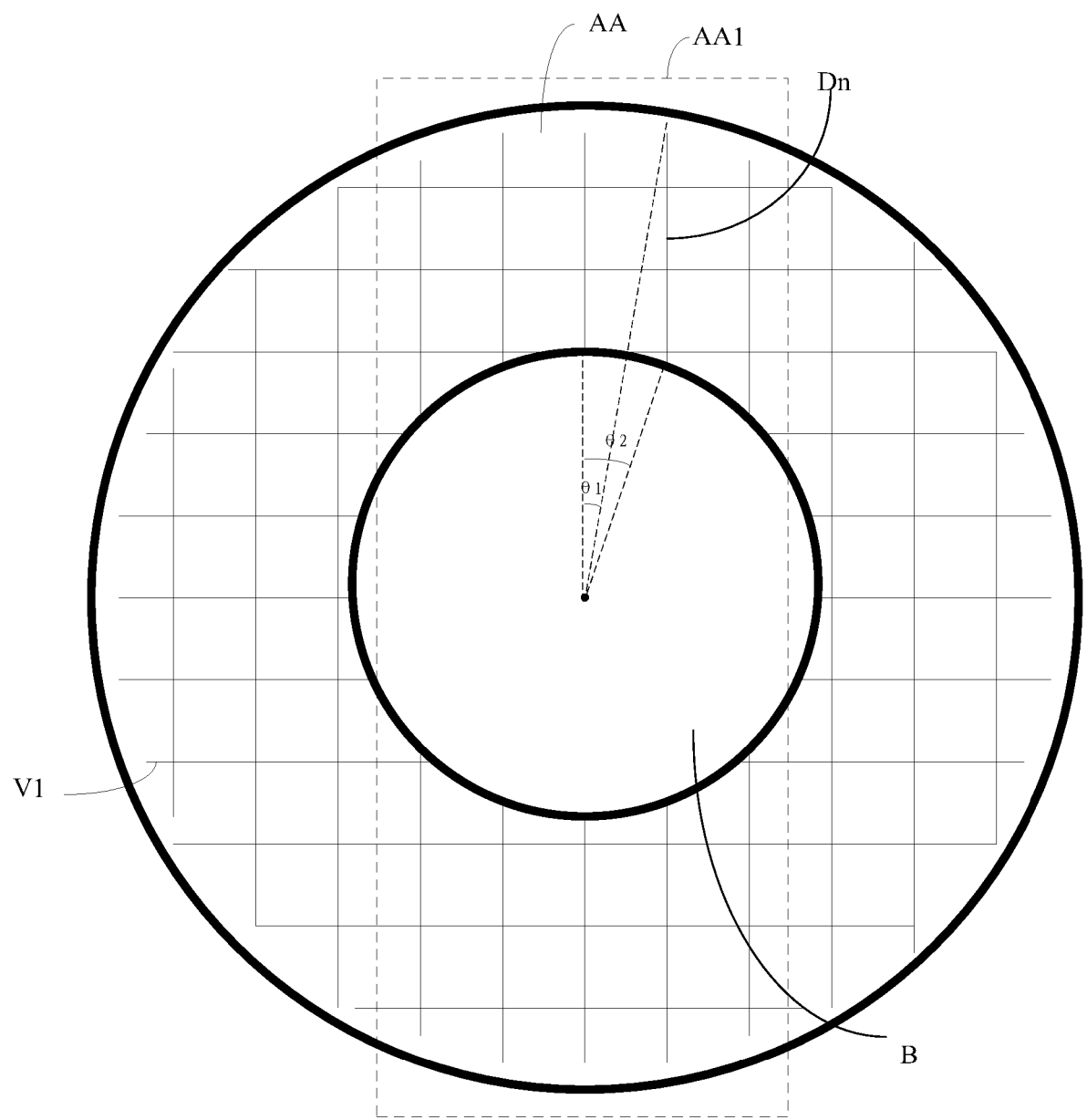
FIG. 15 is a structural schematic diagram of a display panel with irregular shape provided by another embodiment of the present disclosure.

Or, optionally, in the display panel with irregular shape provided by the embodiments of the present disclosure, a display area includes a gap, hollow or blind hole, and all the data lines of the display area extend to the gap, hollow or blind hole. For example, FIG. 15 shows a structural schematic diagram of a display panel with irregular shape provided by another embodiment of the present disclosure, a display area AA further may include a hollow B, and the data lines in the display area AA extend to the hollow B. The hollow B can be located at a middle position of the display area AA, of course, can also be located at an edge position of the display area AA, and limitation is not made herein. The hollow B is not provided with pixels, and some elements with other functions such as a hour hand of a watch can be arranged. In the embodiment of the present disclosure, only the condition that the hollow B is located at the middle position of the display area AA is illustrated.

In the practical application, the gap or hollow can also be located at the top of the display area, elements such as a camera and a loudspeaker are arranged in the hollow B, or the gap or hollow can also be located at the bottom of the display area, touch control elements, etc. can also be arranged at a location of the hollow, and limitation is not made herein.

Or, optionally, in the display panel with irregular shape provided by the embodiments of the present disclosure, the shape of the edge of the display area is of a polygon, circle or ellipse. For example, in FIG. 10 and FIG. 15, the shape of the edge of a display area AA is of a circle, other irregular structures may also be present in the practical application, and enumerating is not made herein.

In the display panel with irregular shape, loads of data lines have difference due to different lengths of the data lines, the data lines are subjected to load compensation by using capacitances formed between the first constant potential lines and the data lines, so that the loads of the data lines connected with less quantity of pixels are increased, the problem of nonuniform display of the display panel is solved, and the display effect is improved. Sizes of the capacitances formed by the first constant potential lines and the data lines can be set according to lengths of the data lines, for example, referring to FIG. 15, in a display subarea AA1, length L (Dn) of the data line Dn is equal to 2(R cos θ1−r cos θ2). In which, R is an excircle radius of the display area, and r is an incircle radius of the display area. It is necessary to note that FIG. 14 and FIG. 15 are only used for describing the shape of a display area of the display panel with irregular shape, and a load compensation mode for the data lines may refer to the above-mentioned embodiments.

Figure 16:
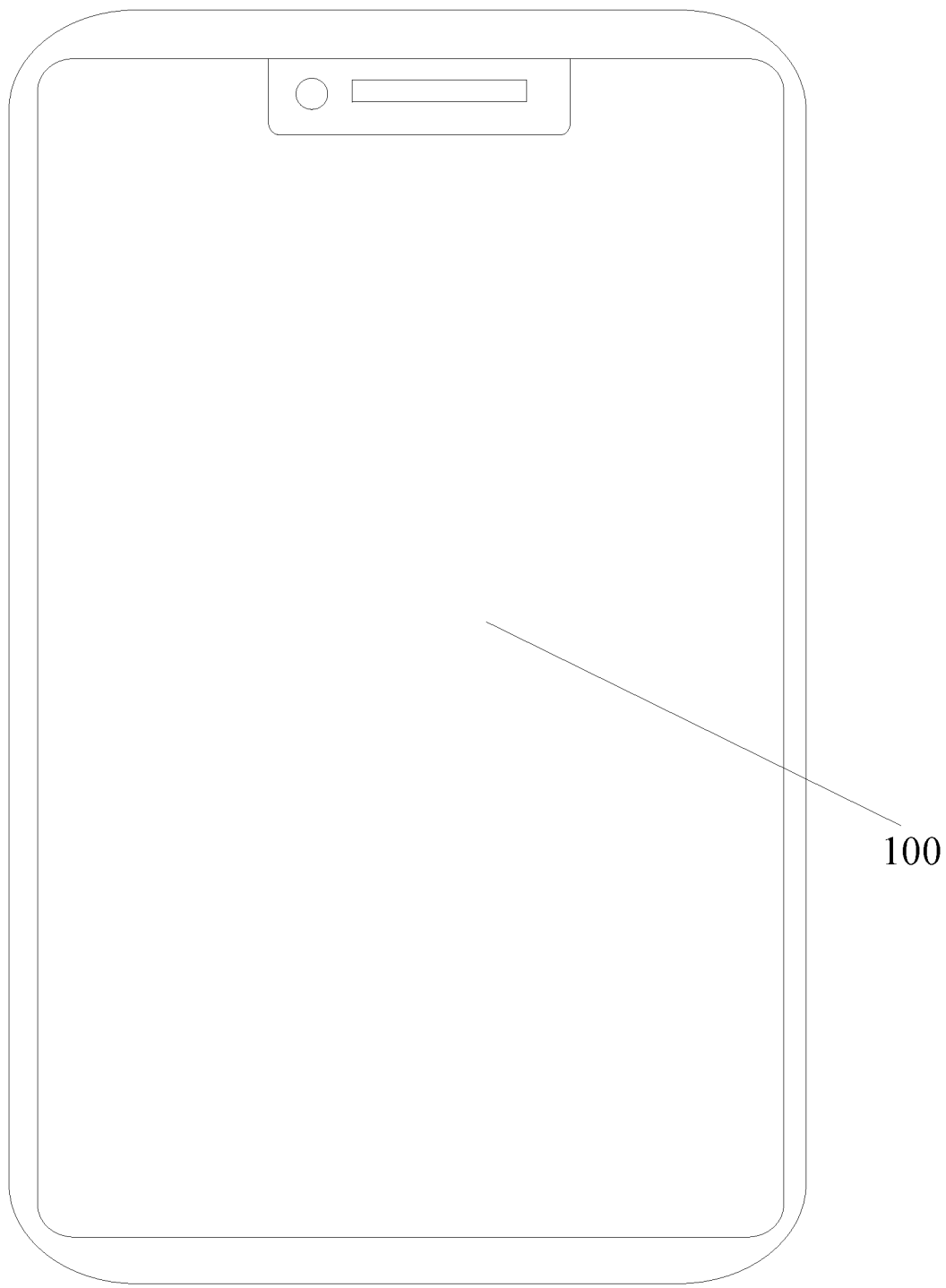
FIG. 16 is a structural schematic diagram of a display device provided by embodiment of the present disclosure.

On the basis of the same inventive concept, embodiments of the present disclosure further provide a display device including any one of the above-mentioned display panel with irregular shapes. The display device may be display devices such as liquid-crystal displays, liquid crystal televisions, organic light-emitting diode (OLED) displays and OLED televisions and may also be mobile equipment such as mobile phones, intelligent watches, smart bracelets, VR/AR eyeglasses, electronic billboards and square displays. FIG. 16 is a top view of the display device provided by the embodiments of the present disclosure when the display device is a mobile phone, in which, a display screen 100 may employ a structure of any one of the above-mentioned display panel with irregular shapes, and limitation is not made herein. The display device provided by the embodiments includes the display panel with irregular shape described in the above-mentioned embodiments, therefore, correspondingly has related advantages of the above-mentioned display panel with irregular shape, the implementation of the display device may refer to embodiments of the above-mentioned display panel with irregular shape, and repetitions are not explained any more.

The embodiments of the present disclosure provide a display panel with irregular shape and a display device. The display panel with irregular shape includes a plurality of first constant potential lines and a plurality of data lines with different lengths; and a display area is divided into a plurality of display subareas in the extending direction of the first constant potential lines, and at least one data line is arranged in each display subarea. The data lines in different display subareas are different in length, different lengths of the data lines mean that the quantity of pixels connected with the data lines is different and loads of the data lines are different, therefore, in order to compensate load difference among the data lines, for the different display subareas, the shorter the data lines in the display subareas are, the larger total overlapped areas of the data lines in the display subareas and the first constant potential lines are, and thus, capacitances between the data lines and the first constant potential lines are increased, so that loads of the data lines connected with less quantity of pixels are increased, the problem of nonuniform display of the display panel is solved, and the display effect is improved.

Although preferred embodiments of the present disclosure are described, additional alterations and modifications of these embodiments can be made by those skilled in the art once a basic creative conception is known. Therefore, attached claims are intended to explain that the claims include the preferred embodiments and all alterations and modifications falling within the scope of the present disclosure.

Apparently, various changes and modifications can be made to the present disclosure by those skilled in the art without departing from the spirit and scope of the present disclosure. Thus, provided that these changes and modifications of the present disclosure belong to scopes of the claims of the present disclosure and equivalent technologies thereof, the present disclosure also intends to include these changes and modifications.

The invention claimed is:

1. A display panel with irregular shapes, comprising:
a plurality of first constant-potential lines; and a plurality of data lines with different lengths arranged in a display area of the display panel;

wherein the plurality of data lines is arranged at a different layer from the plurality of first constant-potential lines;

wherein the plurality of data lines each is intersected with at least one of the plurality of first constant-potential lines, wherein the intersecting lines have an overlapped area in a direction vertical to the display panel;

wherein the display area is divided into a plurality of display subareas in an extending direction of the first constant-potential lines;

wherein at least one of the plurality of the data lines is arranged in each of the display subareas; and wherein for different display subareas, a shorter line in the plurality of the data lines in the display subareas corresponds to a larger total overlapped area of one of the plurality of data lines and one of the plurality of first constant-potential lines.

2. The display panel with irregular shape according to claim 1, wherein at least two of the plurality of data lines are arranged in each of the display subareas; and wherein a total number of overlapped areas of the data lines and a total number of the first constant potential lines in a same display subarea is a same.

3. The display panel with irregular shape according to claim 2, wherein, all of the data lines in a same display subarea have a same length.

4. The display panel with irregular shape according to claim 1, wherein, one data line overlaps with each of the first constant-potential lines at an same overlapped area.

5. The display panel with irregular shape according to claim 1, wherein, a width of each of the plurality of first constant-potential lines at overlapped areas with at least one of plurality of data lines is at least greater than a width of the first constant potential lines at other areas.

6. The display panel with irregular shape according to claim 1, further comprising a plurality of second constant-potential lines arranged in the display area, wherein the plurality of second constant-potential lines and the plurality of data lines extend in a same direction;

wherein the second plurality of constant-potential lines and the plurality of data lines are arranged alternately in the display area; and wherein each of the first constant-potential lines is at least electrically connected with one of the plurality of second constant potential lines.

7. The display panel with irregular shape according to claim 6, wherein, each of the plurality of first constant potential lines comprises a plurality of electrode connecting parts and first traces, each of the first traces is located between any two adjacent electrode connecting parts and electrically connected with two adjacent electrode connecting parts;

each of the electrode connecting parts is electrically connected with one of the plurality of second constant potential lines correspondingly; and wherein a shorter line in the plurality of the data lines in the display subareas corresponds to a larger width of the first traces in an overlapped area of one of the first traces in a same one of the plurality of first constant-potential lines.

8. The display panel with irregular shape according to claim 6, wherein, each of the plurality of first constant-potential lines comprises a plurality of electrode connecting parts and second traces, each of the second traces is located between any two adjacent electrode connecting parts and is connected with corresponding two adjacent electrode connecting parts;

each of the electrode connecting parts is electrically connected with one second constant potential line correspondingly;

wherein a shorter line in the plurality of the data lines in the display subareas corresponds to a larger width of the second traces in an overlapped area of one of the second traces in a same one of the plurality of first constant-potential lines; and wherein the width of the second traces at the overlapped areas with the data lines is greater than a width of the second traces at other areas.

9. The display panel with irregular shape according to claim 7, further comprises storage electrodes arranged in the display area, wherein the storage electrodes are arranged in an one-to-one correspondence to all the electrode connecting parts, and arranged at a layer different from a layer where the electrode connecting parts are; and wherein the storage electrodes and corresponding electrode connecting parts have overlapped areas in a direction vertical to the display panel and form memory capacitors.

10. The display panel with irregular shape according to claim 8, further comprising storage electrodes arranged in the display area, the storage electrodes are arranged in an one-to-one correspondence to all the electrode connecting parts, and arranged at a layer different from a layer where the electrode connecting parts are; and wherein the storage electrodes and corresponding electrode connecting parts have overlapped zones in a direction vertical to the display panel and form memory capacitors.

11. The display panel with irregular shape according to claim 9, wherein, orthographic projections of the electrode connecting parts on the storage electrodes cover the storage electrodes.

12. The display panel with irregular shape according to claim 9, further comprising a plurality of scan lines arranged in the display area;

wherein the scan lines and the storage electrodes are arranged at a same layer.

13. The display panel with irregular shape according to claim 6, wherein, the plurality of second constant potential lines and the plurality of data lines are arranged at a same layer.

14. The display panel with irregular shape according to claim 6, further comprising a plurality of third constant potential lines arranged in the display area;

wherein an extending direction of the plurality of third constant potential lines is same as an extending direction of the plurality of first constant potential lines, and the plurality of third constant potential lines are electrically connected with the plurality of first constant potential lines.

15. The display panel with irregular shape according to claim 14, wherein, for different display subareas, a shorter data line in the display subareas corresponds to a larger total overlapped area of said data line in the display subareas and all said plurality of third constant potential lines.

16. The display panel with irregular shape according to claim 1, wherein,
the plurality of first constant potential lines comprises supply voltage signal lines.

17. The display panel with irregular shape according to claim 1, wherein,
at least part of edges of the display area are of a curved edge, rounded corner, bevel edge or cut, and the data lines extend to the curved edge, rounded corner, bevel edge or cut.

18. The display panel with irregular shape according to claim 1,
Wherein the display area comprises a gap, a hollow or blind hole, and wherein the plurality of data lines of the display area extends to the gap, the hollow or blind hole.

19. The display panel with irregular shape according to claim 1, wherein,
a shape of an edge of the display area is a polygon, a circle or an ellipse.

20. A display device, comprising a display panel with irregular shape, wherein the display panel comprises a plurality of first constant potential lines and a plurality of data lines with different lengths arranged in a display area of the display panel;
wherein the plurality of data lines and the plurality of first constant potential lines are arranged at different layers, and wherein the plurality of data lines and the plurality of first constant potential lines are arranged at different layers, wherein the plurality of data lines each and the plurality of first constant potential lines each are arranged to intersect with each other and have overlapped areas in a direction vertical to the display panel;
wherein the display area is divided into a plurality of display subareas in an extending direction of the first constant potential lines, and at least one data line is arranged in each of the display subareas; and
for different display subareas, a shorter one of the plurality of data lines in the display subareas is associated with a larger total overlapped area between the data line in the display subareas and the associated one of the plurality first constant potential lines.

* * * * *